United States Patent
Hochschild

(10) Patent No.: US 6,614,375 B2
(45) Date of Patent: Sep. 2, 2003

(54) SIGMA-DELTA ANALOG-TO-DIGITAL CONVERTER HAVING IMPROVED REFERENCE MULTIPLEXER

(75) Inventor: James R. Hochschild, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/214,992

(22) Filed: Aug. 8, 2002

(65) Prior Publication Data

US 2003/0052806 A1 Mar. 20, 2003

Related U.S. Application Data

(60) Provisional application No. 60/323,774, filed on Sep. 19, 2001.

(51) Int. Cl.[7] ............................................... H03M 3/02
(52) U.S. Cl. ..................................................... 341/143
(58) Field of Search ................................. 341/143, 118, 341/144, 155, 139, 154

(56) References Cited

U.S. PATENT DOCUMENTS

| | | | |
|---|---|---|---|
| 5,594,612 A | | 1/1997 | Henrion |
| 5,821,890 A | * | 10/1998 | Kim ........................... 341/143 |
| 5,912,593 A | | 6/1999 | Susak et al. |
| 5,990,753 A | | 11/1999 | Danstrom et al. |
| 6,362,697 B1 | | 3/2002 | Pulvirenti |
| 6,373,343 B1 | | 4/2002 | Baldwin et al. |
| 6,531,973 B2 | * | 3/2003 | Brooks ........................ 341/143 |

OTHER PUBLICATIONS

Abdulkerim L. Coban, Phillip E. Allen, "MP 3.1: A 1.5V 1.0mW Audio ΔΣ Modulator with 98dB Dynamic Range," ISSC 99/Session 3/Oversampled Modulators/Paper MP 3.1. (1999).

Frank Op't Eynde, Guang Ming Yin, Wily Sansen, "WPM 4.1: A CMOS Fourth-Order 14b 500k-Sample/s Sigma-Delta ADC Converter," 1991 IEEE International Solid-State Circuits Conference. (1991).

Abdulkerim L. Coban, Phillip E. Allen, "MP 3.1 A 1.5V 1.0mW Audio ΔΣ Modulator with 98dB Dynamic Range," 1999 IEEE International Solid-State Circuits Conference. (1999).

* cited by examiner

Primary Examiner—Brian Young
(74) Attorney, Agent, or Firm—April M. Mosby; Wade James Brady III; Frederick J. Telecky, Jr.

(57) ABSTRACT

A low power, sigma-delta analog-to-digital converter having an improved reference multiplexer that eliminates noise in a reference voltage signal. The sigma-delta analog-to-digital converter includes a passive filter circuit connected to receive a differential reference voltage input. The improved differential multiplexer couples to the passive filter circuit to receive the reference voltage signal. This differential multiplexer includes three modes of operation: (1) direct coupling of its differential input to its differential output, (2) cross-coupling of its differential input to its differential output, and (3) setting of the differential output to a fixed voltage to discharge the parasitic capacitance associated its differential output every clock cycle. This last mode of operation eliminates the noise of the reference voltage signal and ultimately the sigma-delta ADC. A sigma-delta integrator receives the differential output from the differential multiplexer. A comparator couples to the output of the sigma-delta integrator to provide a decision signal to the differential multiplexer for enabling and disabling the first and second modes of operation; while a clocking signal fed to the differential multiplexer is responsible for enabling and disabling the third mode of operation.

7 Claims, 3 Drawing Sheets

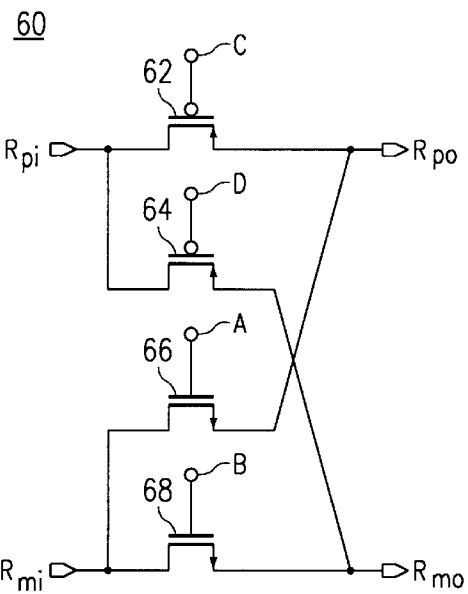
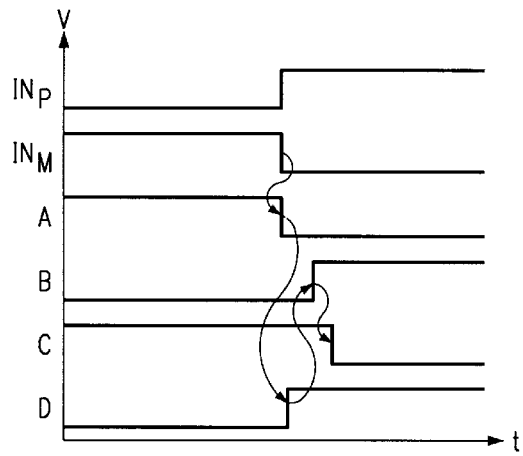
FIG. 4       FIG. 5
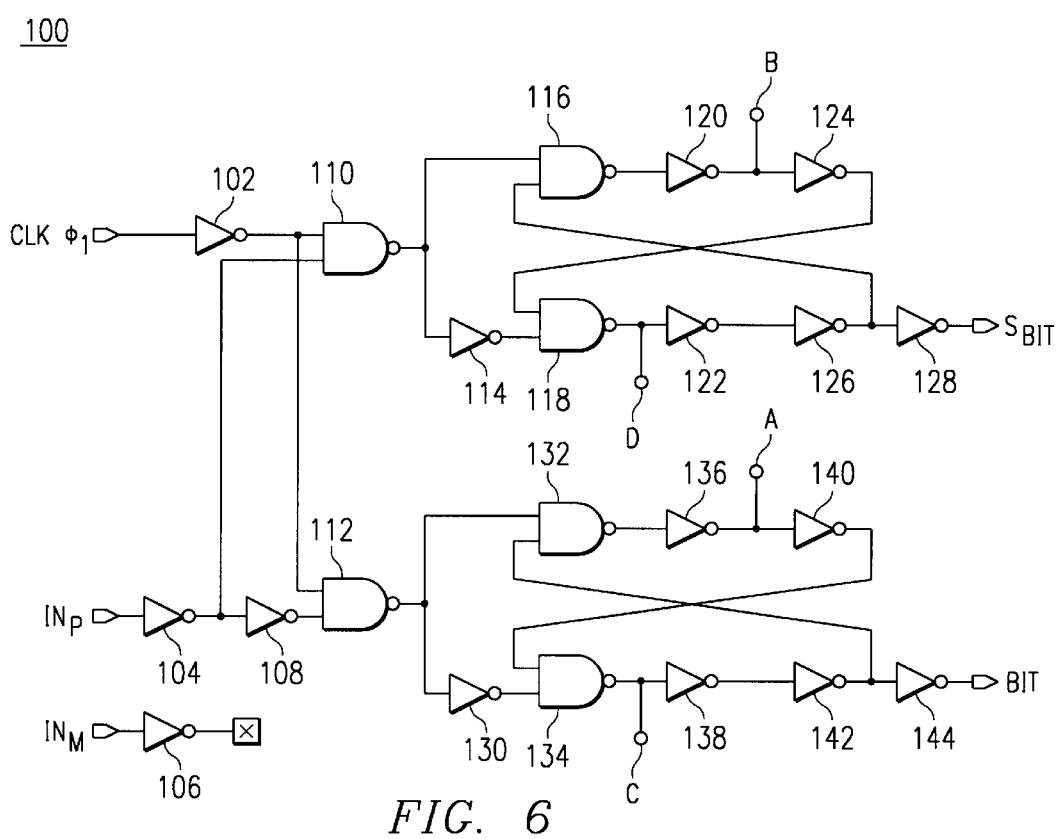
FIG. 6

SIGMA-DELTA ANALOG-TO-DIGITAL CONVERTER HAVING IMPROVED REFERENCE MULTIPLEXER

This application claims priority under 35 USC §119(e) (1) of provisional application Serial No. 60/323,774, filed Sep. 19, 2001.

FIELD OF THE INVENTION

The present invention relates to sigma-delta analog-to-digital converters, and, more particularly, to a sigma-delta analog-to-digital converter having an improved low power multiplexer.

BACKGROUND OF THE INVENTION

High resolution sigma-delta analog-to-digital converter (ADC) technology has become a key analog circuit technology for digital audio and telecommunications applications. Sigma-delta ADC's are capable of providing precision greatly in excess of sixteen bits. For low power applications, however, it is desirable to decrease the power consumption for the overall circuit.

Many conventional sigma-delta ADCs include one or more sigma-delta integrators, a comparator and a differential reference multiplexer. As is known, the sigma-delta integrators couple to receive inputs from any analog external source needing a conversion from analog to digital. The comparator couples to receive the output of sigma-delta integrator for implementation of the quantization step to generate a differential pair of decision signals.

As in most designs, these sigma-delta integrators require a reference voltage to operate. Thus, a reference voltage is generated using an active circuit such as an amplifier. To reduce power consumption, however, it is desirable to eliminate the active circuit. Most known designs replace the active circuit with reference voltage applied across passive filter circuit including a filter capacitor to generate reference multiplexer inputs. The reference multiplexer receives these reference multiplexer inputs along with the decision signals from the comparator. A first set of output signals from the reference multiplexer provide a shadow bit scheme and a second set of reference output signals provide either an inverted or non-inverted differential reference feedback to the sigma-delta integrator depending upon the comparator decision signals. These reference output signals represent the quantized decision of the sigma-delta integrator multiplied by the reference voltage; whereby, the sigma-delta integrator maintains the average value of the feedback to be equal to the reference voltage input.

The leads corresponding to the second set of reference output signals, however, each have a parasitic capacitance associated with it that generates noise in the sigma-delta ADC as a result of the reference multiplexer's dual modes of operation. In particular, in a first mode, the reference inputs directly feed into the reference outputs and, as a result, the reference voltage signal is not inverted, such that the reference voltage outputs remain the same. When the reference multiplexer switches from the first mode to the second mode, however, a first parasitic capacitor charges from the negative reference input to the positive reference input and a second parasitic capacitor discharges from the positive reference input to the negative reference input.

The second mode of operation cross couples the reference inputs to be fed into differing reference outputs such that the reference voltage is effectively inverted. As a result, when the reference multiplexer switches from the second mode to the first mode, the first parasitic capacitor discharges from the positive reference input to the negative reference input and the second parasitic capacitor charges from the negative reference input to the positive reference input.

Charging either the first or the second parasitic capacitor draws charge off the filter capacitor which reduces the reference input voltage slightly. Due to the random nature of charging and discharging the filter capacitor, low frequency noise results in the reference input voltage signal. This low frequency noise on the filtered reference degrades the SNR performance of the ADC.

Due to this degradation in performance, there is a need to decrease, if not eliminate, the noise in the reference voltage input signals in a sigma-delta ADC given the design constraints of low power consumption.

SUMMARY OF THE INVENTION

To address the above-discussed deficiencies of sigma-delta analog-to-digital converters (ADC), the present invention teaches a low power, sigma-delta ADC having an improved reference multiplexer that eliminates noise in the reference signal. The sigma-delta ADC includes a passive filter circuit connected to receive a differential reference voltage input. The improved differential multiplexer couples to the passive filter circuit to receive the reference voltage signal. This differential multiplexer includes three modes of operation: (1) direct coupling of the differential input to the differential output, (2) cross-coupling of the differential input to the differential output, and (3) setting the differential output to a fixed voltage to discharge the parasitic capacitance in the differential output every clock cycle. This last mode eliminates the noise of the reference voltage signal and ultimately the sigma-delta ADC. A sigma-delta integrator receives the differential output from the differential multiplexer. A comparator couples to the output of the sigma-delta integrator to provide a decision signal to the differential multiplexer for enabling and disabling the first and second modes of operation. A clocking signal fed to the differential multiplexer is responsible for enabling and disabling the third mode of operation that discharges the parasitic capacitance in the differential outputs of the differential multiplexer.

Advantages of this design include but are not limited to a low noise, low power sigma-delta ADC.

BRIEF DESCRIPTION OF THE DRAWINGS

For a more complete understanding of the present invention and the advantages thereof, reference is now made to the following description taken in conjunction with the accompanying drawings in which like reference numbers indicate like features and wherein:

FIG. 4 displays a second portion of a known reference multiplexer;

FIG. 5 illustrates a graph for several signals of the known reference multiplexer;

FIG. 6 displays a first portion of a reference multiplexer in accordance with the present invention;

DETAILED DESCRIPTION OF PREFERRED EMBODIMENTS

Figure 1:
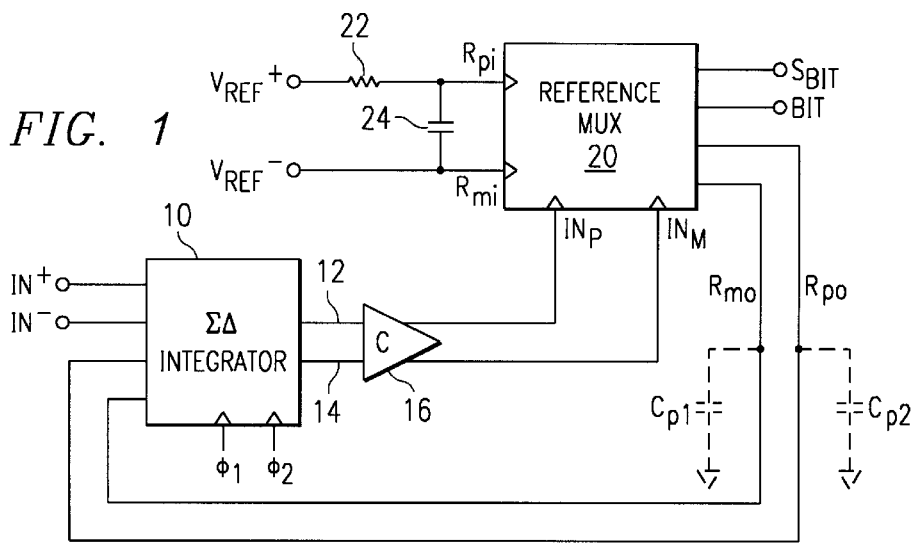
FIG. 1 illustrates a known sigma-delta ADC.

The present invention is best understood by comparison with the prior art. Hence, this detailed description begins with a discussion of the known built-in sigma-delta ADC as shown in FIG. 1. As described sigma-delta ADC shown in FIG. 1 includes one or more sigma-delta integrators 10, a comparator 16 and a reference multiplexer 20. Sigma-delta integrators 10 receive inputs from any analog external source needing a conversion from analog to digital. In a particular hearing aid application, the external source may be a microphone preamplifier (not shown). Clocking signals $\Phi_1$ and $\Phi_2$ are complementary clocking signals that do not make signal transitions simultaneously. The output of sigma-delta integrator 10 is fed into comparator 16 to implement the quantization step for generating a differential pair of signals $IN_p$ and $IN_m$ which represent decision signals. These decision signals, $IN_p$ and $IN_m$ are fed into the reference multiplexer 20 along with reference input signals, $R_{pi}$ and $R_{mi}$. Sigma-delta integrators 10 require a reference voltage to operate which is generated using an active circuit such as an amplifier used as a buffer. To reduce power consumption, however, it is desirable to eliminate the active circuit and replace it with a passive filter circuit including capacitor 24 and resistor 22 to generate reference multiplexer inputs, $R_{pi}$ and $R_{mi}$, where the reference voltage is applied at the reference voltage nodes, $V_{ref}^+$ and $V_{ref}^-$.

Whenever a bit switches, it draws current out of the power supply, such that the current pulled from the power supply is signal dependent. Thus, if there is imperfect power supply rejection in the analog portion of the block and the same power supply is shared for the logic, unintentional feedback from the output signal may be generated back to the power supply and analog blocks. The first set of output signals, SBIT and BIT, provide shadow bit scheme whereby, if the logical output is a '1', a pulse would be provided on the output BIT and, if the logical output is a '0', a pulse would be provided on the output SBIT. The second set of reference output signals, $R_{po}$ and $R_{mo}$, provide either an inverted or non-inverted differential reference feedback to the sigma-delta integrator 10 depending upon the comparator 16 decision. Sigma-delta integrator 10 only needs the reference voltage for half time when the integration clock phase $\Phi_2$ is high. Sigma-delta systems include a feedback similar to the reference output signals, $R_{po}$ and $R_{mo}$, which represent the quantized decision multiplied by the reference voltage. The sigma-delta integrator 10 maintains the average value of the feedback to be equal to the input.

Figure 3:
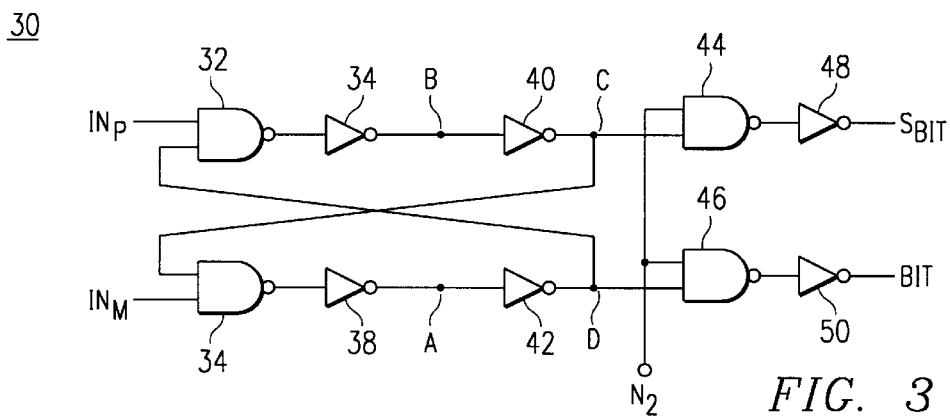
FIG. 3 shows a first portion of a known reference multiplexer.

The known reference multiplexer 20 includes a first portion 30 as shown in FIG. 3 and a second portion 60 as shown in FIG. 4. The first portion 30 includes cross coupled NAND gates 32 and 34 coupled to inverters 36, 38, 40 and 42 to define nodes A, B, C, and D. NAND gates, 44 and 46, couple to receive the outputs from nodes C and D as well as node $N_2$. Through inverters 48 and 50 these NAND gates, 44 and 46, provide output signals to nodes SBIT and BIT.

FIG. 4 represents the second portion 60 of the known reference multiplexer 20. Reference inputs, $R_{pi}$ and $R_{mi}$, couple to transistors 62, 64, 66, and 68 to form nodes A, B, C and D. Reference outputs, $R_{po}$ and $R_{mo}$, couple to reference input signals $R_{pi}$ and $R_{mi}$ depending upon which switches are on and off. Using FIG. 5, when input signal $IN_p$ is low and input signal $IN_m$ is high, node A goes from high to low which switches transistor 66 off and node D switches from low to high which switches transistor 64 off. The transition in node D causes node B to switch from low to high and accordingly node C switches from high to low. This arrangement prevents transistors 62 and 66 from being on at the same time as well as transistors 64 and 68 from being on at the same time. The objective is not to short reference inputs, $R_{pi}$ and $R_{mi}$, where neither transistors 62 and 66 are on at the same time nor transistors 64 and 68 are on even for a short incidence due to a change in the decision input $IN_p$. The arrangement of cross-coupled NAND gates and inverters which form delays insures that theses switches are not simultaneously on. NAND gate 32 prevents signal B from switching until signal D has switched. NAND gate 34 prevents signal A from switching until signal C has switched. Since transistors, 66 and 68, are NMOS transistors, when nodes A and B are high, each transistor, 66 and 68, is on. Accordingly, when nodes A and B are low, each transistor, 66 and 68, is off. Since transistors, 62 and 64, are PMOS transistors, when nodes C and D are low, each transistor, 62 and 64, is on. Accordingly, when nodes C and D are high, each transistor, 66 and 68, is off.

Reference multiplexer 20 has two modes of operation. The first mode includes the reference inputs, $R_{pi}$ and $R_{mi}$, directly fed into the parallel reference outputs, $R_{po}$ and $R_{mo}$. In this mode, the reference voltage signal is not inverted, such that the reference voltage outputs, $R_{po}$ and $R_{mo}$, remain the same. Specifically, in this first mode, when nodes B and D are high and nodes A and C are low, transistors, 62 and 68, are on and transistors, 64 and 66, are off. When reference multiplexer 20 switches from the first mode to the second mode, however, capacitor $C_{p1}$ charges from reference input $R_{mi}$ to reference input $R_{pi}$ and capacitor $C_{p2}$ discharges from reference input $R_{pi}$ to reference input $R_{mi}$.

The second mode of operation cross couples the reference inputs, $R_{pi}$ and $R_{mi}$, to be fed into differing reference outputs, $R_{mo}$ and $R_{po}$, such that the reference voltage $V_{ref}$ is effectively inverted. Specifically, in this second mode, when nodes A and C are high and nodes B and D are low, transistors, 64 and 66, are on and transistors, 62 and 68, are off. As a result, when reference multiplexer 20 switches from the second mode to the first mode, capacitor $C_{p1}$ discharges from reference input $R_{pi}$ to reference input $R_{mi}$ and capacitor $C_{p2}$ charges from reference input $R_{mi}$ to reference input $R_{pi}$.

Charging the capacitor $C_{p1}$ or $C_{p2}$ draws charge off the filter capacitor 24 which reduces its voltage slightly. This second mode of operation is a random event. As explained, due to this random nature of charging and discharging the filter capacitor, noise results in the reference input voltage signal $R_{pi}$ which is shown as the signal labeled (1) in the graph of FIG. 2. This low frequency noise on the filtered reference degrades the SNR performance of the ADC.

Figure 7:
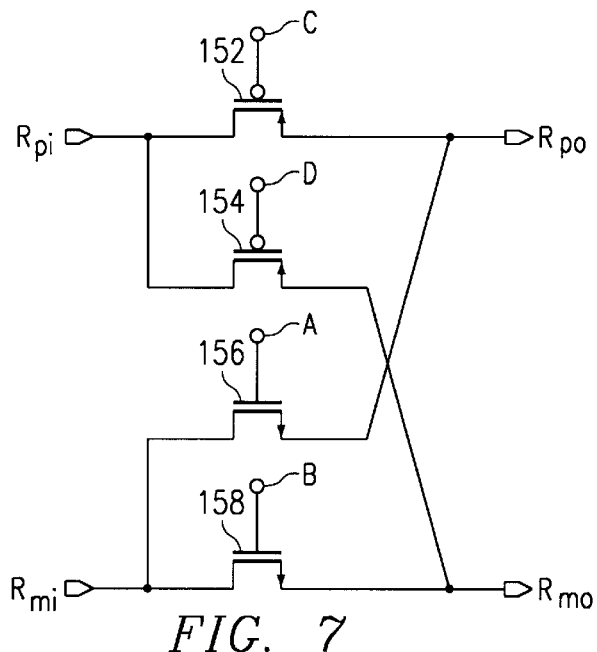
FIG. 7 shows a second portion of a reference multiplexer in accordance with the present invention.

The sigma-delta ADC having an improved reference multiplexer as shown in FIGS. 6 and 7 in accordance with the present invention which eliminates noise. FIG. 6 illustrates the first sub-circuit portion of the reference multiplexer in accordance with the present invention. Clock signal input $\Phi_1$ is fed into inverter 102 to control when both lines of the multiplexer output, $R_{mo}$ and $R_{po}$, are both connected to the minus voltage reference $R_{mi}$. Input signal $IN_p$ connects to inverter 104. The output of inverters 102 and 104 couple into NAND gate 110. The output of inverter 104 feeds into inverter 108 to provide input for NAND gate 112 along with the output of inverter 102. NAND gate 110 supplies output to a first cross coupled NAND gate pair, 116 and 118. NAND gate 112 supplies output to a second cross-coupled NAND gate pair, 132 and 134. These two pairs are to provide the three modes of operation which will be discussed. The first cross coupled pair, 116 and 118, include inverters 120, 122, 124, 126, and 128 coupled to form nodes B, D and SBIT. The second cross coupled pair, 132 and 134, include inverters 136, 138, 140, 142, and 144 coupled to form nodes A, C and BIT. FIG. 7 displays the second portion of the improved reference multiplexer similar to FIG. 4 as discussed above for the known reference multiplexer 20 and remains virtually the same.

In operation, there are three modes of operation. As explained, the clock signal input $\Phi_1$ determines when both lines of the multiplexer output, $R_{mo}$ and $R_{po}$, are both connected to the negative voltage reference $R_{mi}$. In a first mode of operation, when the clock signal input $\Phi_1$ is high, both reference outputs $R_{po}$ and $R_{mo}$ are forced to reference input $R_{mi}$ which discharges the two parasitic capacitors $C_{p1}$ and $C_{p2}$, since transistors 152 and 154 are off and transistors 156 and 158 are on. Thus, in this state both parasitic capacitors $C_{p1}$ and $C_{p2}$ are discharged at every cycle. This corresponds to a new decision in the sigma-delta integrator 10 to remove the signal dependence on the drain of charge of the filter capacitor $C_f$. When the clock signal input $\Phi_1$ is low, which is indicative of the sigma-delta integrator 10 needing the reference voltage, either one of the reference outputs $R_{po}$ and $R_{mo}$ will make a transition from low to the positive reference voltage $R_{pi}$ depending on the decision signal $IN_p$. In a second mode of operation where the clock signal input $\Phi_1$ is low and the decision signal $IN_p$ is high, the reference outputs $R_{po}$ and $R_{mo}$ directly couple to reference inputs $R_{pi}$ and $R_{mi}$, respectively. In this mode, nodes B and D are high and nodes A and C are low, transistors, 152 and 158, are on and transistors 154 and 156, are off. In the third mode of operation, where the clock signal input $\Phi_1$ is low and the decision signal $IN_p$ is low, the reference outputs $R_{po}$ and $R_{mo}$ cross couple to reference inputs $R_{mi}$ and $R_{pi}$, respectively. In this mode, nodes A and C are high and nodes B and D are low, transistors, 152 and 158, are off and transistors, 154 and 156, are on. Thereby, this improved reference multiplexer 100 proves an additional state, the first state, that discharges the parasitic capacitors $C_{p1}$ and $C_{p2}$ to eliminate noise while providing a complementary pair of signals that are guaranteed not to be on or off at the same time.

The improved first portion of reference multiplexer 100 no longer needs the gating logic of FIG. 3 that is controlled by signal $N_2$ to correct outputs SBIT and BIT because the behavior of the outputs are appropriate for these two signals SBIT and BIT of multiplexer 100.

Figure 2:
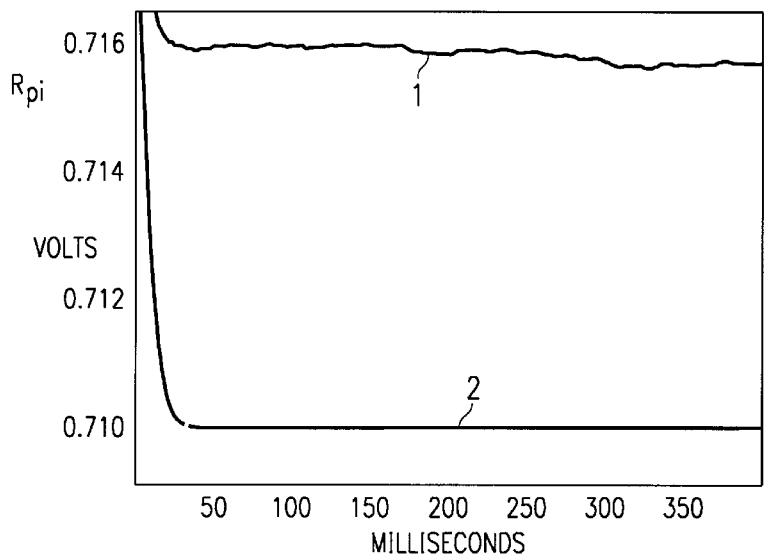
FIG. 2 displays the reference voltage input signals (1) for the known sigma-delta ADC and (2) for the sigma-delta ADC in accordance with the present invention.

In addition, FIG. 2 shows the distinction between the prior art reference output signal, signal (1), and that of the ADC in accordance with the present invention, signal (2). The DC voltage difference between signal (1) and (2) is a result of the charge being drawn off the filter capacitor 24 for signal (1) in a data dependent way. For signal (2), however, charge is drawn off the filter capacitor 24 every clock cycle. Thus, signal (2) has a lower DC value than signal (1).

Figure 8:
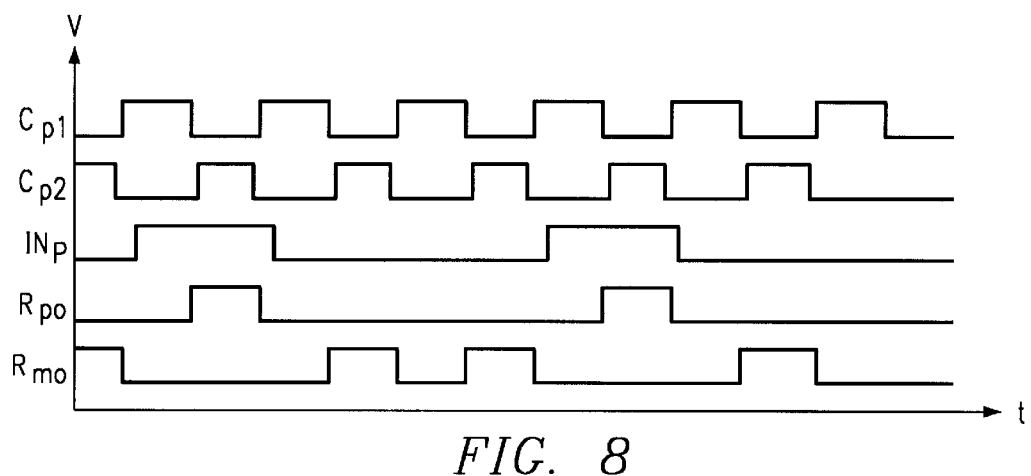
FIG. 8 illustrates a graph for several signals of the reference multiplexer in accordance with the present invention.

FIG. 8 illustrates corresponding transitions in signals $\Phi_1$, $\Phi_2$, $IN_p$, $R_{po}$, and $R_{mo}$. Clocks $\Phi_1$ and $\Phi_2$ are complements of one another and are never simultaneously high. When clock $\Phi_2$ is high, this is indicative of when the sigma-delta integrator 10 needs the reference voltage. The reference output signals $R_{po}$ and $R_{mo}$ that feed back to the sigma-delta integrator 10 are only used during the integration clock phase of signal $\Phi_2$. Thus, when signal $\Phi_2$ is high, this is when the integrator 10 is using the reference output signals $R_{po}$ and $R_{mo}$.

The foregoing described sigma-delta ADC's primary application may be incorporations in any low power application including hearing aid devices.

Advantages of this design include but are not limited to a sigma-delta ADC having a high performance, simple, and cost effective design.

The reader's attention is directed to all papers and documents which are filed concurrently with this specification and which are open to public inspection with this specification, and the contents of all such papers and documents are incorporated herein by reference.

All the features disclosed in this specification (including any accompany claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

I claim:

1. A low-noise, sigma-delta analog-to-digital converter having a differential reference voltage input, a first differential input, and a first and second clock signal input, comprising:

a passive filter circuit having a first differential output, the passive filter circuit coupled to receive the differential reference voltage input;

a differential multiplexer coupled to receive the first clock signal, the differential multiplexer having a second differential input and second and third differential output, the second differential input coupled to receive the first differential output of the passive filter circuit, each second differential output having an inherent parasitic capacitance, the differential multiplexer including a mode of operation whereby the parasitic capacitance of the second differential output discharges every clock cycle;

a sigma-delta integrator coupled to receive the first differential input, the first and second clock signals, and the second differential output of the differential multiplexer; and a comparator coupled to the output of the sigma-delta integrator to provide a decision signal, the differential multiplexer coupled to receive the decision signal.

2. The low noise, sigma-delta analog-to-digital converter as recited in claim 1 wherein the differential multiplexer, comprising:

a first sub-circuit portion coupled to receive the clock signal input and the decision signal to provide the third differential output and a first, second, third, and fourth control signal; and a second sub-circuit portion coupled between the second differential input and the second differential output, the second sub-circuit portion coupled to receive the first, second, third and fourth control signals to provide a first, second and third mode of operation, the first mode of operation to directly couple the second differential input to the second differential output, the second mode of operation to cross-couple the second differential input to the second differential output, the third mode of operation to couple the second differential output to a predetermined voltage to discharge the inherent parasitic capacitance in the second differential output.

3. The differential multiplexer as recited in claim 2, wherein the first circuit portion comprising:

a first inverter coupled to the clock signal input;

a second inverter coupled to the decision signal;

a third inverter coupled to the second inverter;

a first pair of NAND gates including a first and second NAND gate, each NAND gate having a first and second input and an output, the output of the first inverter coupled to the first input of the first NAND gate and the first input of the second NAND gate, the output of the second inverter coupled to the second input of the first NAND gate, the output of the third inverter coupled to the second input of the second NAND gate;

a first latch, having a first and second node, coupled to receive the output of the first NAND gate to generate the first and the second control signal at the first and second node; and a second latch, having a third and fourth node, coupled to receive the output of the second NAND gate to generate the third and fourth control signal at the third and fourth node.

4. The differential multiplexer as recited in claim 3, wherein the a first latch comprising:

a fourth inverter coupled to the output of the first NAND gate;

a second pair of cross-coupled NAND gates including a third and fourth NAND gate, each NAND gate having a first and second input and an output, the first input of the third NAND gate coupled to the output of the first NAND gate, the first input of the fourth NAND gate coupled to the output of the fourth inverter;

a fifth inverter coupled to the output of the third NAND gate;

a sixth inverter coupled to the output of the fifth inverter to form a first node, the output of the sixth inverter coupled to the second input of the fourth NAND gate;

a seventh inverter coupled to the output of the fourth NAND gate to form a second node;

an eighth inverter coupled to the output of the seventh inverter, the output of the eighth inverter coupled to the second input of the third NAND gate; and a ninth inverter coupled to the output of the eighth inverter to provide a pulse output at the third differential output.

5. The differential multiplexer as recited in claim 3, wherein the second latch comprising:

a fourth inverter coupled to the output of the first NAND gate;

a second pair of cross-coupled NAND gates including a third and fourth NAND gate, each NAND gate having a first and second input and an output, the first input of the third NAND gate coupled to the output of the first NAND gate, the first input of the fourth NAND gate coupled to the output of the fourth inverter;

a fifth inverter coupled to the output of the third NAND gate;

a sixth inverter coupled to the output of the fifth inverter to form a first node, the output of the sixth inverter coupled to the second input of the fourth NAND gate;

a seventh inverter coupled to the output of the fourth NAND gate to form a second node;

an eighth inverter coupled to the output of the seventh inverter, the output of the eighth inverter coupled to the second input of the third NAND gate; and a ninth inverter coupled to the output of the eighth inverter to provide a pulse output at the third differential output.

6. The differential multiplexer as recited in claim 2, wherein the a second circuit portion comprising:

a first transistor pair, including a first NMOS transistor and a first PMOS transistor, coupled directly between the second differential input and the second differential output, each transistor having a gate, a drain, and a source;

a second transistor pair, including a second NMOS transistor and a second PMOS transistor, cross-coupled between the second differential input and the second differential output, each transistor having a gate, a drain, and a source; and the first sub-circuit portion for controlling the second sub-circuit portion wherein the first, second, third, and fourth nodes couple to the gates of the first NMOS transistor, the second PMOS transistor, the second NMOS transistor, the first PMOS transistor, respectively.

7. A differential multiplexer having a differential input, a differential output, a clock signal input, and a decision signal input, comprising:

a first sub-circuit portion including a first inverter coupled to the clock signal input, a second inverter coupled to the decision signal input, a third inverter coupled to the second inverter, a first pair of NAND gates including a first and second NAND gate, each NAND gate having a first and second input and an output, the output of the first inverter coupled to the first input of the first NAND gate and the first input of the second NAND gate, the output of the second inverter coupled to the second input of the first NAND gate, the output of the third inverter coupled to the second input of the second NAND gate, a fourth inverter coupled to the output of the first NAND gate, a second pair of cross-coupled NAND gates including a third and fourth NAND gate, each NAND gate having a first and second input and an output, the first input of the third NAND gate coupled to the output of the first NAND gate, the first input of the fourth NAND gate coupled to the output of the fourth inverter, a fifth inverter coupled to the output of the third NAND gate, a sixth inverter coupled to the output of the fifth inverter to form a first node, the output of the sixth inverter coupled to the second input of the fourth NAND gate, a seventh inverter coupled to the output of the fourth NAND gate to form a second node, an eighth inverter coupled to the output of the seventh inverter, the output of the eighth inverter coupled to the second input of the third NAND gate, a ninth inverter coupled to the output of the second NAND gate, a third pair of cross-coupled NAND gates including a fifth and sixth NAND gate, each NAND gate having a first and second input and an output, the first input of the fifth NAND gate coupled to the output of the second NAND gate, the first input of the sixth NAND gate coupled to the output of the ninth inverter, a tenth inverter coupled to the output of the fifth NAND gate, a eleventh inverter coupled to the output of the tenth inverter to form a third node, the output of the eleventh inverter coupled to the second input of the sixth NAND gate, a twelfth inverter coupled to the output of the sixth NAND gate to form a fourth node, a thirteenth inverter coupled to the output of the twelfth inverter, the output of the thirteenth inverter coupled to the second input of the fifth NAND gate; and a second circuit portion including
  a first transistor pair, including a first NMOS transistor and a first PMOS transistor, coupled directly between the differential input and the differential output, each transistor having a gate, a drain, and a source, a second transistor pair, including a second NMOS transistor and a second PMOS transistor, cross-coupled between the differential input and the differential output, each transistor having a gate, a drain, and a source, the first sub-circuit portion for controlling the second sub-circuit portion wherein the first, second, third, and fourth nodes couple to the gates of the first NMOS transistor, the second PMOS transistor, the second NMOS transistor, the first PMOS transistor, respectively.

* * * * *